United States Patent
Tsubota et al.

(10) Patent No.: US 7,833,604 B2
(45) Date of Patent: Nov. 16, 2010

(54) AG ALLOY REFLECTIVE LAYER FOR OPTICAL INFORMATION RECORDING MEDIUM, OPTICAL INFORMATION RECORDING MEDIUM, AND SPUTTERING TARGET FOR FORMING AG ALLOY REFLECTIVE LAYER FOR OPTICAL INFORMATION RECORDING MEDIUM

(75) Inventors: Takayuki Tsubota, Kobe (JP); Takeshi Ohwaki, Kobe (JP); Hideo Fujii, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 371 days.

(21) Appl. No.: 11/947,170

(22) Filed: Nov. 29, 2007

(65) Prior Publication Data

US 2008/0131308 A1    Jun. 5, 2008

(30) Foreign Application Priority Data

Dec. 1, 2006   (JP)   .............. 2006-325788

(51) Int. Cl.
B32B 3/02   (2006.01)
(52) U.S. Cl. ............ 428/64.1; 428/64.4; 430/270.11
(58) Field of Classification Search .......... None
See application file for complete search history.

(56) References Cited

FOREIGN PATENT DOCUMENTS

| JP | 4-28032 | 1/1992 |
|---|---|---|
| JP | 4-252440 | 9/1992 |
| JP | 2001126315 A | * 5/2001 |
| JP | 2002-15464 | 1/2002 |
| JP | 2004-139712 | 5/2004 |
| JP | 2005293646 | * 10/2005 |
| JP | 2006-48899 | 2/2006 |
| WO | WO 2004094135 A1 | * 11/2004 |
| WO | WO 2005020222 A1 | * 3/2005 |

OTHER PUBLICATIONS

U.S. Appl. No. 12/266,065, filed Nov. 6, 2008, Tauchi, et al.
U.S. Appl. No. 12/167,597, filed Jul. 3, 2008, Takagi, et al.
U.S. Appl. No. 12/513,254, filed May 1, 2009, Sakamoto, et al.
U.S. Appl. No. 12/368,413, filed Feb. 10, 2009, Ohwaki, et al.

(Continued)

*Primary Examiner*—Elizabeth Mulvaney
(74) *Attorney, Agent, or Firm*—Oblon, Spivak, McClelland, Maier & Neustadt, L.L.P.

(57) ABSTRACT

An Ag alloy reflective layer for optical information recording medium having excellent environmental resistance, an optical information recording medium having such Ag alloy reflective layer, and the like are provided. This Ag alloy reflective layer for an optical information includes 0.1 to 5 atomic % in total of at least one element selected from W, Ti, V, Mn, Zr, Cr, and Ni; 0.005 to 1 atomic % of Bi; and the residue of Ag and inevitable impurities. As a consequence, this Ag alloy reflective layer has improved environmental resistance including the light resistance for the light beam of particular wavelength and resistance to moist heat under particular set of conditions.

19 Claims, 1 Drawing Sheet

OTHER PUBLICATIONS

U.S. Appl. No. 12/183,700, filed Jul. 31, 2008, Tauchi, et al.
U.S. App. No. 12/198,520, filed Aug. 26, 2008, Tauchi, et al.
U.S. Appl. No. 12/625,022, filed Nov. 24, 2009, Matsuzaki, et al.
U.S. Appl. No. 12/604,858, filed Oct. 23, 2009, Takagi, et al.
U.S. Appl. No. 12/261,781, filed Oct. 30, 2008, Matsuzaki.

* cited by examiner

AG ALLOY REFLECTIVE LAYER FOR OPTICAL INFORMATION RECORDING MEDIUM, OPTICAL INFORMATION RECORDING MEDIUM, AND SPUTTERING TARGET FOR FORMING AG ALLOY REFLECTIVE LAYER FOR OPTICAL INFORMATION RECORDING MEDIUM

BACKGROUND OF THE INVENTION

1. Field of the Invention

This invention relates to a silver (Ag) alloy reflective layer for an optical information recording medium, an optical information recording medium having such Ag alloy reflective layer, and a sputtering target for forming such Ag alloy reflective layer. The term "reflective layer" is used in the present invention as an inclusive expression including both the reflective layer and semi-transparent reflective layer (semi-transparent layer). The present invention is excellent in environmental resistance such as resistance to light and resistance to moist heat, and therefore, suitable for use as a reflective layer which is required to have such environmental resistance, an optical information recording medium having such reflective layer, and a sputtering target for forming such reflective layer.

2. Description of the Related Art

When used for the reflective layer of an optical disk (hereinafter also referred to as an optical information recording medium), Ag alloy reflective layers exhibit superior properties such as higher reflectivity, higher transmittance lower absorption [absorption=100%−(reflectivity+transmittance)], and higher thermal conductivity compared to other materials.

However, in the optical disk having such Ag alloy reflective layer, improvement of long term reliability, namely, maintenance of such performance for a long time has become an important technical agenda. The long term reliability is most seriously affected by environmental resistance such as the resistance to moist heat and the resistance to light of the Ag alloy reflective layer.

For example, dispersion of the Ag from the Ag alloy reflective layer to the resin layer adjacent to the reflective layer and aggregation of the Ag in the resin layer is more likely to take place when an optical disk is used at a higher temperature and higher humidity. Such dispersion and aggregation of the Ag is problematic since such Ag dispersion and aggregation cause increase in the surface roughness and discontinuity of the Ag alloy reflective layer, which in turn results in the loss of the reflectivity, namely, marked loss of the function as a reflective layer or a semi-transparent reflective layer.

The dispersion and aggregation of the Ag from the Ag alloy reflective layer to the resin layer adjacent to the reflective layer is also likely to take place when the optical disk is used under a lighted condition, for example, under the condition illuminated by a fluorescence lamp. Such Ag dispersion and aggregation also invites loss of the reflectivity, and the signal can no longer be reproduced when the reflectivity is reduced to the level below the lower limit at which detection of the reproducible signal is possible.

Alloying of the Ag by the addition of a particular rare earth element, namely, improvement of the Ag alloy used for the reflective layer has been proposed by various patent applications. For example, Ag alloy reflective layers of Ag—Cu—Au—(Nd, Sn, Ge) and the like, and Ag alloy reflective layers, Ag—(Bi, Sb)—(Cu, Au), Ag—(Bi, Sb)-(rare earth element: Nd, Y)—(Cu, Au) and the like have been proposed (see Japanese Patent Application Laid-Open Nos. 2002-15464 and 2004-139712: Patent Documents 1 and 2).

Also proposed is decrease of the thermal conductivity by reducing thermal conductivity of the Ag alloy constituting the reflective layer. More specifically, the thermal conductivity is reduced by adding Ge, Si, Sn, Pb, Ga, In, Tl, Sb, or Bi to the Ag (see Japanese Patent Application Laid-Open No. 1992-252440: Patent Document 3). Also proposed is the method in which the thermal conductivity is decreased by adding Cr, Ti, Si, Ta, Nb, Pt, Ir, Fe, Re, Sb, Zr, Sn, or Ni to the Ag (see Japanese Patent Application Laid-Open No. 1992-28032: Patent Document 4).

However, these reflective layers including the conventional Ag alloy do not disclose the object of improving the environmental resistance such as the resistance to moist heat and the resistance to light. As will described later, in an optical information recording medium, and in particular, when the metal reflective layer is in direct contact with the UV curable resin layer or the organic dye recording layer, the reflective layer including the conventional Ag alloy is likely to experience loss of the environmental resistance.

With regard to the problem of the loss of the environmental resistance of the Ag alloy reflective layer when the metal reflective layer is in direct contact with the UV curable resin layer or the organic dye recording layer, Japanese Patent Application Laid-Open No. 2006-48899: Patent Document 5) proposes a solution by providing an Ag alloy reflective layer containing Li, and more specifically, an Ag alloy containing 0.01 to 10 atomic % of Li. This document also discloses the selective incorporation of each of Bi: 0.005 to 0.8 atomic %; rare earth metal element (Sc, Y, La, Ce, Pr, Nd, Pm, Sm, Eu, Gd, Tb, Dy, Ho, Er, Tm, Yb, Lu) in total of 0.1 to 2 atomic %; and at least one member selected from Cu, Au, Rh, Pd, and Pt in total of 0.1 to 3 atomic %.

SUMMARY OF THE INVENTION

However, the inventors of the present invention have found that this reflective layer including an Ag alloy containing Li of Japanese Patent Application Laid-Open No. 2006-48899 (Patent Document 5) is still insufficient in environmental resistance such as the resistance to moist heat and the resistance to light that would be required in the long term use of the optical disk even if the layer further includes Bi, a rare earth metal element, a precious metal element such as Cu or Au, and the like. Despite the improvement in the environmental resistance, the reflective layer including the Li-containing Ag alloy experiences loss of environmental resistance in a relatively short term, and then, the environmental resistance such as the resistance to moist heat and the resistance to light is no longer maintained at the satisfactory level.

One major reason for this drawback is the excessively short period used for the evaluation of the environmental resistance such as the resistance to moist heat and the resistance to light in the Japanese Patent Application Laid-Open No. 2006-48899 (Patent Document 5). When the time used for evaluating the environmental resistance is insufficient as in the case of Japanese Patent Application Laid-Open No. 2006-48899 (Patent Document 5), the test results will not be adequately related to the environmental resistance of the optical disk that has been actually used for a long period.

For example, the light resistance is evaluated in Japanese Patent Application Laid-Open No. 2006-48899 (Patent Document 5) by measuring loss of spectral reflectivity and spectral transparency when the sample including an Ag alloy layer having a UV curable resin layer formed thereon is irradiated with UV and visible light beam at an irradiation density of 120 W/m² and an irradiation temperature of 80° C. for an irradiation period of 144 hours. This test period is too short.

In addition, resistance to aggregation (resistance to moist heat) is evaluated in the Japanese Patent Application Laid-Open No. 2006-48899 (Patent Document 5) by maintaining the sample including an Ag alloy layer having a UV curable resin layer formed thereon under a high temperature, high humidity condition at temperature of 80° C. and a humidity (relative humidity) of 90% for 48 hours. This test period is also too short.

In view of such situation, there is a need for an optical disk including an Ag alloy reflective layer having an improved environmental resistance in the sense that the excellent environmental resistance such as the resistance to moist heat and the resistance to light is maintained for a long period of time even if the optical disk includes an Ag alloy reflective layer in direct contact with the resin layer.

The present invention has been made in view of the situation as described above, and an object of the present invention is to provide an Ag alloy reflective layer for an optical information recording medium which is capable of retaining excellent environmental resistance such as the resistance to moist heat and the resistance to light for a prolonged period even if the metal reflective layer and the resin layer are in direct contact with each other. Another object of the present invention is to provide an optical information recording medium having such reflective layer, and a sputtering target used in producing such reflective layer.

To address such object, one aspect of the present invention resides in the Ag alloy reflective layer which is an Ag alloy reflective layer for an optical recording medium including 0.1 to 5 atomic % in total of at least one element selected from W, Ti, V, Mn, Zr, Cr, and Ni, 0.005 to 1 atomic % of Bi, and the residue of Ag and inevitable impurities.

To address such object, another aspect of the present invention resides in the optical information medium which is an optical information recording medium having an Ag alloy reflective layer including 0.1 to 5 atomic % in total of at least one element selected from W, Ti, V, Mn, Zr, Cr, and Ni, 0.005 to 1 atomic % of Bi, and the residue of Ag and inevitable impurities.

To address such object, still another aspect of the present invention resides in the sputtering target used for forming the Ag alloy reflective layer which is the one including 0.1 to 5 atomic % in total of at least one element selected from W, Ti, V, Mn, Zr, Cr, and Ni, 0.005 to 1 atomic % of Bi, and the residue of Ag and inevitable impurities.

In the present invention, maintenance of excellent environmental resistance such as the resistance to moist heat and the resistance to light for a long time is referred to as the improvement in the environmental resistance. Such improvement in the environmental resistance is realized in the aspects of the present invention by providing an optical information recording medium having an Ag alloy reflective layer including An and at least one element selected from W, Ti, V, Mn, Zr, Cr, and Ni, and Bi.

In the Ag alloy reflective layer containing such particularly selected elements at a predetermined amount, the mode of deterioration caused by dispersion and aggregation of the Ag in the reflective layer or the semi-transparent layer to the adjacent resin layer such as the UV curable resin layer or the organic dye recording layer is suppressed. As a consequence, the Ag alloy reflective layer of the aspects of the present invention is provided with an improved environmental resistance including both the moist heat resistance and the light resistance, and this excellent environmental resistance including both the moist heat resistance and the light resistance is maintained for a long period.

The read only optical disk actually used has a cross-sectional structure including a polycarbonate (hereinafter also simply referred to as PC) substrate, an Ag alloy reflective layer deposited on the PC substrate, an ultraviolet (UV) curable resin layer formed on the reflective layer by spin coating, and a PC substrate adhered to the resin layer. In the case of a write-once optical disk, a resin layer such as an organic dye recording layer is spin coated on a PC substrate (hereinafter also referred to as a PC substrate); an Ag alloy reflective layer is formed on this resin layer; a ultraviolet (UV) curable resin layer is formed on the reflective layer by spin coating; and a PC substrate is adhered to the UV curable resin layer.

Another type of the optical disk includes two of the structures as described above adhered to one another to thereby double the recording capacity. In the case of a read only optical disk, an Ag alloy semi-transparent reflective layer is formed on a substrate; a ultraviolet (UV) curable resin layer is formed on the reflective layer by spin coating; and this is adhered with a substrate formed with an Ag alloy or Al ally reflective layer to thereby form a laminate. A write-once optical disk is similarly formed by adhering a PC substrate having formed thereon an organic dye recording layer and an Ag alloy semi-transparent reflective layer with a substrate having formed thereon an Ag alloy reflective layer and an organic dye recording layer to thereby form a laminate; or alternatively, by adhering a PC substrate having an organic dye recording layer and an Ag alloy semi-transparent reflective layer with an organic dye recording layer and an Ag alloy reflective layer.

As described above, an optical disk in which the Ag semi-transparent layer or the Ag reflective layer (both of which are hereinafter simply referred to as the Ag reflective layer) is in direct contact with the resin layer is associated with the mode of deterioration caused by the dispersion of the Ag from the reflective layer to the resin layer and aggregation in the resin layer in both hot moist environment and light-irradiated environment. In other words, improvement in the durability of the Ag reflective layer or the optical information recording medium using such Ag reflective layer can be realized only by suppressing such deterioration mode in which the Ag of the reflective layer disperses and aggregates in the resin layer.

As described above, there has been no proposal of an Ag alloy reflective layer which improves resistance to moist heat and light except for the Japanese Patent Application Laid-Open No. 2006-48899 (Patent Document 5), and the improvement of the resistance to moist heat and light has not been realized. One reason for this situation may be the way how the resistance to moist heat and the resistance to light of the optical disk having an Ag alloy reflective layer had been evaluated.

The resistance to moist heat and the resistance to light of an optical disk having an Ag alloy reflective layer had been conducted by using a single layer sample including a substrate such as a polycarbonate substrate and only the Ag layer. In such evaluation using a single layer sample such as the one including the polycarbonate substrate, deterioration of the mode caused by dispersion of the Ag in the reflective layer to the resin layer and aggregation therein is not theoretically possible and such deterioration does not occur. Accordingly, accurate evaluation of the resistance to moist heat and the resistance to light was simply not possible by such conventional evaluation using a single layer sample.

In order to conduct an accurate evaluation of the optical information medium for its environmental resistance, the evaluation should be conducted for the structure (condition)

having the resin layer formed in contact with the Ag alloy so that the deterioration of the mode caused by the dispersion and aggregation of Ag to the resin layer can occur, and such deterioration can be evaluated by measuring and evaluating change in the reflection properties of the disk.

More specifically, the evaluation of the resistance to light should be conducted by preparing a optical information recording medium (test medium) including a substrate of polycarbonate or the like, an Ag alloy layer, and a resin layer wherein the Ag alloy layer and the resin layer are in contact with each other, and irradiating the medium with a light beam of a particular wavelength, and measuring and evaluating change (decrease) in the reflectivity before and after the irradiation. The evaluation of the resistance to moist heat should be conducted by placing such optical information recording medium in a hot moist environment, and measuring and evaluating decrease in the reflectivity of the optical information recording medium. Both the light resistance and the resistance to moist heat are important as the environmental resistance of an optical information recording medium.

The at least one element selected from W, Ti, V, Mn, Zr, Cr, and Ni and the Bi incorporated in the Ag alloy reflective layer of the aspects of the present invention has been selected and distinguished based on the evaluation criteria for the resistance to light and the resistance to moist heat as will be described below from other type and content of the rare earth elements which fail to satisfy such criteria. In other words, no significant difference will be found for the at least one element selected from W, Ti, V, Mn, Zr, Cr, and Ni and the Bi of the aspects of the present invention when evaluation is conducted by using the conventional single layer sample medium having solely Ag thin layer formed on the substrate of polycarbonate or the like. The advantage of the at least one element selected from W, Ti, V, Mn, Zr, Cr, and Ni and the Bi of the aspects of the present invention can be distinguished over other elements only by using the evaluation conditions of the aspects of the present invention where the deterioration mode as described above is theoretically present and possible.

As described above, the composition of the Ag alloy reflective layer has been determined in the aspects of the present invention after accurately evaluating the reflection properties of the optical information recording medium in which the deterioration mode as described above can occur. Accordingly, the Ag alloy reflective layer of the aspects of the present invention has enabled to improve the environmental resistance including both the resistance to moist heat and the light resistance of the Ag alloy reflective layer for an optical information recording medium by suppressing the mode of the deterioration caused by the dispersion and aggregation of the Ag to the UV curable resin, and maintaining such excellent environmental resistance including the resistance to moist heat and the resistance to light for a prolonged period.

In the optical information recording medium having such reflective layer, the environmental resistance including the resistance to moist heat and the resistance to light of the recording medium has been improved, and such excellent environmental resistance including the resistance to moist heat and the resistance to light is maintained for a long time. Furthermore, since the sputtering target including an Ag alloy has the composition which is substantially the same as the composition of the Ag reflective layer, deposition of an Ag alloy reflective layer having the improved environmental resistance including the resistance to moist heat and the resistance to light has been enabled.

DESCRIPTION OF THE PREFERRED EMBODIMENTS

Figure 1:
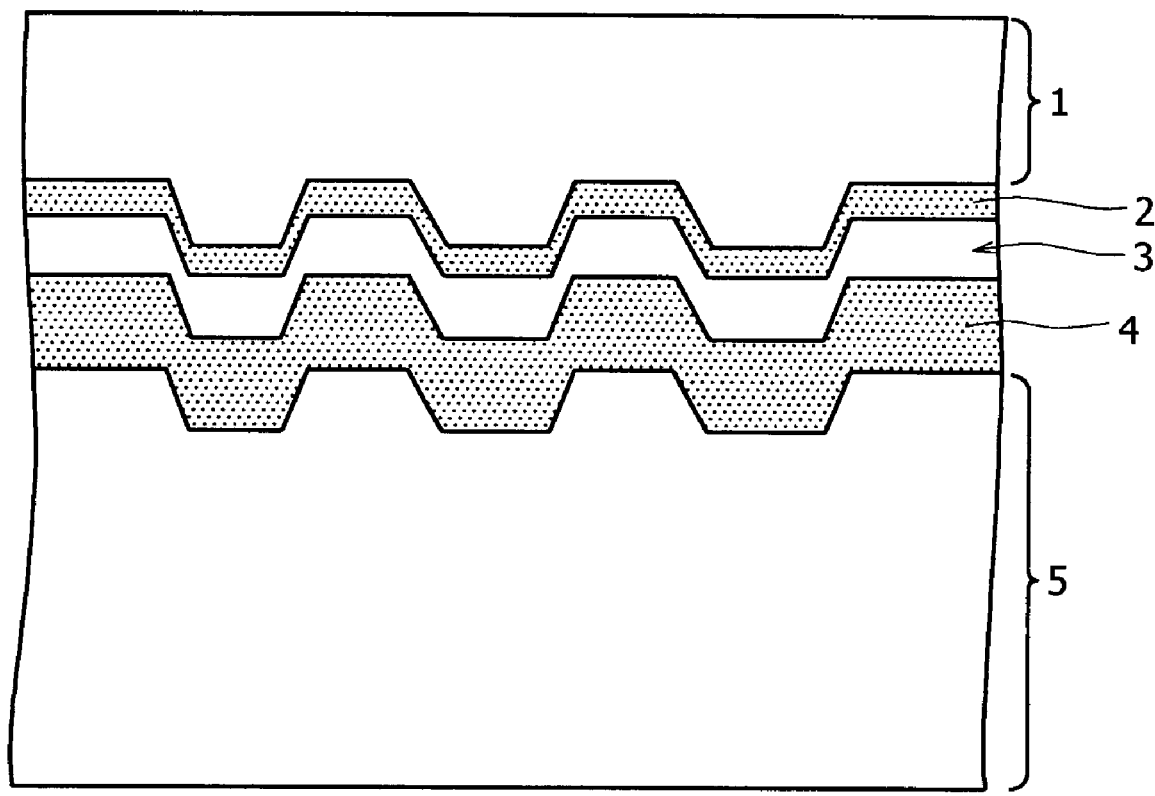
FIG. 1 is a schematic view of the cross-sectional structure of a read only optical disk.

Next, the requirements and embodiments of the present invention are described in detail.

[Optical Information Recording Medium]

First, the "optical information recording medium" intended in the present invention is described. The "optical information recording medium" intended in the present invention is primarily an optical disk. The optical disks include several different types, and in view of the write/read principle, the optical disks are divided into three types, namely, read only optical disk, write-once optical disk, and rewritable optical disk. The characteristic feature of the present invention resides in the composition of the reflective layer, and the structure and shape of the optical disk that are the prerequisite for the optical information recording medium may be adequately selected from those of commercially available products.

Among these, a read only optical disk has a structure formed by providing a substrate of a transparent plastic material (a transparent resin) such as polycarbonate formed with recording pits (surface irregularities) which retain the record data, and thereafter forming an Ag alloy reflective layer on the substrate. Besides the reflective layer containing Ag as its main component, there are reflective layers containing Al, Au, and the like as its main component. These reflective layers, however, are not the intended in the present invention. With regard to the substrate, the substrate may also include glass, aluminum, carbon, or other materials in addition to the substrate including the resin such as polycarbonate.

FIG. 1 is a schematic cross-sectional view of an embodiment of such read only optical disk. The optical disk of FIG. 1 includes polycarbonate substrates 1 and 5, a semi-transparent reflective layer 2 of an Ag alloy which is characteristic to the present invention, a ultraviolet light (UV) curable resin adhesive layer 3, and a total reflection layer 4 of an Ag alloy which is characteristic to the present invention.

With regard to the read only optical disk, the data is read by irradiating the disk with a laser beam and detecting the phase difference and reflection difference caused in such irradiation. In FIG. 1, the transparent plastic resin substrate 5 having recording pits formed thereon having the reflective layer 4 formed thereon corresponds to the cross-sectional structure as described above including the PC substrate 5, the Ag alloy reflective layer 4 formed on the PC substrate 5, and the ultraviolet light (UV) curable resin layer 3 formed on the reflective layer 4 by spin coating.

The optical disk shown in FIG. 1 is of the type wherein the data is recorded in two different layers provided by adhering the structure as described above with the transparent plastic substrate 1 provided with the semi-transparent reflective layer (semi-transparent layer). As shown in FIG. 1, this disk has been prepared by providing the PC substrate 1 having a semi-transparent layer 2 of an Ag alloy; and adhering this semi-transparent layer 2 to the Ag alloy total reflection layer 4 formed on the PC substrate 5 by an intervening ultraviolet light (UV) curable resin layer.

Next, chemical composition of the Ag alloy reflective layer of the present invention is described. The Ag alloy reflective layer of the present invention has a chemical composition including 0.1 to 5 atomic % in total of at least one element selected from W, Ti, V, Mn, Zr, Cr, and Ni, 0.005 to 1 atomic % of Bi, and the residue of Ag and inevitable impurities in order to realize the basic properties of the reflective layer for an optical information recording medium including the environmental resistance and the initial reflectivity.

W, Ti, V, Mn, Zr, Cr, and Ni:

The Ag alloy reflective layer of the present invention contains 0.1 to 5 atomic % in total of at least one element selected from W, Ti, V, Mn, Zr, Cr, and Ni as its critical component. This component incorporated simultaneously with the Bi has the effect of improving the environmental resistance of the Ag alloy reflective layer.

The W, Ti, V, Mn, Zr, Cr, and/or Ni readily forms an oxide, and therefore, these alloying elements are capable of reacting with the oxygen in the UV curable resin layer in contact with the reflective layer or the semi-transparent layer to stabilize the oxygen. As a consequence, incorporation of such element has a great effect of suppressing the mode of deterioration caused by the dispersion and aggregation of the Ag from the reflective layer or the semi-transparent layer to the UV curable resin layer by the reaction of the Ag with such oxygen. These alloying elements also are capable of retaining such effects. Accordingly, the Ag alloy reflective layer exhibits the excellent environmental resistance such as the resistance to moist heat and the resistance to light for a prolonged period, and the "environmental resistance" in the sense of the present invention is improved. This effect is even more enhanced by the simultaneous in corporation of the Bi.

These elements are incorporated at an amount of at least 0.1 atomic % in order to realize the sufficient effect. However, an excessive incorporation of such element results in the loss of basic properties such as reflectivity and semi-transparency. Accordingly, there is no need to incorporate these elements at an amount in excess of 5 atomic %.

Bi:

In addition to the elements of W, Ti, V, Mn, Zr, Cr, and/or Ni, the Ag alloy reflective layer of the present invention contains Bi as its critical component, and this Bi is incorporated at an amount of 0.005 to 1 atomic %. Bi has the effect of improving the environmental resistance of the Ag alloy reflective layer when incorporated simultaneously with the elements of W, Ti, V, Mn, Zr, Cr, and Ni. As in the case of elements of W, Ti, V, Mn, Zr, Cr, and Ni, Bi has a relatively small free energy of forming the oxide, and Bi is readily capable of forming an oxide. Accordingly, Bi forms an oxide with the oxygen in the UV curable resin layer in contact with the reflective layer or the semi-transparent layer and stabilizes the Ag. The mode of deterioration caused by the dispersion and aggregation of Ag in the reflective layer and the semi-transparent layer to the UV curable resin layer by the reaction with the oxygen as described above is believed to be suppressed by this mechanism.

Bi is incorporated at an amount of at least 0.005 atomic % to realize such effect. However, incorporation of an excessive amount of Bi results in the loss of basic properties of the layer such as reflectivity and semi-transparency. Accordingly, there is no need to incorporate the Bi in excess of 1 atomic %.

In the Ag alloy reflective layer of the present invention, the components other than the elements of W, Ti, V, Mn, Zr, Cr, and/or Ni and the Bi are the impurity. Accordingly, the components other than the elements of W, Ti, V, Mn, Zr, Cr, and/or Ni and the Bi are the Ag and the inevitable impurities.

[Production of the Ag Alloy Reflective Layer]

The Ag alloy reflective layer of the present invention is formed by sputtering or vapor deposition of the sputtering target including the Ag alloy on the surface of the substrate of PC or the like. Use of a sputtering target formed from an Ag alloy having a composition substantially the same as that of the Ag reflective layer of the present invention facilitates formation of the Ag reflective layer having the composition of the present invention.

Accordingly, the sputtering target used in forming the Ag alloy reflective layer having the Ag alloy of the present invention may preferably include 0.1 to 5 atomic % in total of at least one element selected from W, Ti, V, Mn, Zr, Cr, and Ni, 0.005 to 1.5 atomic % of Bi, and the residue of Ag and inevitable impurities.

In this sputtering, Bi has unique situation that the loss of the Bi increases with the increase in the thickness of the reflective layer, and the content of the Bi in the resulting Ag alloy reflective layer tends to be less than the Bi content of the target. In view of this situation, Bi content of the target is preferably increased in relation to the Bi content of the Ag alloy reflective layer depending on the thickness of the reflective layer. Accordingly, the upper limit of the Bi content of the target is set at a higher value than the upper limit of the Bi content of the Ag alloy reflective layer.

The Ag alloy reflective layer can be formed by using a plurality of sputtering targets each containing at least one element selected from W, Ti, V, Mn, Zr, Cr, and Ni, or B as long as the reflective layer can be formed, and the resulting layer the Ag reflective layer has the composition of the present invention.

The methods used in the sputtering or the vapor deposition may be any of the method known or widely used in the art for the formation of a thin layer. However, in view of the stability of the layer formed, the preferred is the sputtering using a DC magnetron.

The sputtering target used may be prepared by melting an Ag alloy having the composition corresponding to or substantially corresponding the Ag alloy reflective layer of the present invention as described above, or combination of alloys or pure metals corresponding to the alloying elements of such Ag alloy reflective layer, and forming the molten metal into an appropriate shape such as a plate. The sputtering target may also be prepared from the same material(s) by melting method such as spray forming or powder metallurgy.

The thus formed Ag alloy reflective layer of the present invention is used in the subsequent process of producing the cross-sectional and surface structures required for an optical information recording medium of the present invention.

[Evaluation of Light Resistance]

As described above, the present invention includes within its scope several types of the optical information recording mediums (optical disks). However, evaluation of the light resistance in the present invention is conducted under conditions common to all types of the optical information recording mediums. The evaluation is also conducted under the conditions in which improvement of the environmental resistance can be confirmed, namely, under the conditions in which the deterioration of the mode caused by the dispersion and aggregation of the Ag to the UV curable resin layer would occur, and such mode of deterioration could be suppressed for a long period. Evaluation under such conditions enables use of the evaluation results in determining feasibility of the tested sample for use in the optical information recording medium (the optical disk) of the type intended in the present invention, and such evaluation can also be conducted with a high reproducibility. This also applies to the evaluation of the resistance to moist heat as will be described later.

In the present invention, the light resistance is evaluated for an optical information recording medium including a polycarbonate substrate, an Ag alloy layer, and a UV curable resin layer wherein the Ag alloy layer and the UV curable resin layer are in contact with each other, and the evaluation is carried out by irradiating the medium with a light beam having a short wavelength of 405 nm (the wavelength used for the next generation medium) and a light beam having a wavelength of 650 nm (the currently used wavelength) for at least 200 hours (h) and measuring change in the reflectivity of the optical information recording medium before and after the irradiation.

In the case of the Ag alloy layer (reflective layer) having an average thickness of 15 nm (a semi-transparent layer), this change in the reflectivity of the optical information recording medium before and after the irradiation should be up to (within) 3.5%, and preferably up to (within) 2% when measured by irradiating a light beam at a wavelength of 405 nm, and this change in the reflectivity is used for the criteria in evaluating the environmental resistance of the present invention. When the evaluation is conducted by irradiating a light beam at a wavelength of 650 nm, the change in the reflectivity used as a criteria in evaluating the environmental resistance of the present invention should be up to 1.5%, and the change is preferably up to 1%.

In the case of a relatively thick Ag alloy layer (reflective layer) having an average thickness of 60 nm (a total reflection layer), this change in the reflectivity of the optical information recording medium before and after the irradiation should be up to 3%, and preferably up to 1% when measured by irradiating a light beam at a wavelength of 405 nm, and this change in the reflectivity is used for the criteria in evaluating the environmental resistance of the present invention. When the evaluation is conducted by irradiating a light beam at a wavelength of 650 nm, the change in the reflectivity used as a criteria in evaluating the environmental resistance of the present invention should be up to 1%, and the change is preferably up to 0.5%.

The thus produced optical information recording medium is irradiated with the light from a fluorescence lamp, and the reflectivity was measured at a wavelength of 405 nm which is the wavelength used for reading and writing the data in the next generation optical disk (Blu-ray, HD-DVD), and 650 nm which is the wavelength used in the current DVD.

In the evaluation of the light resistance, a fluorescence lamp at a color temperature of 6700 K which is capable of producing the light beam having the wavelength as described above is placed at a position 60 mm from the disk, and the disk is irradiated with the light beam from the fluorescence lamp. The evaluation is conducted at temperature of 25° C., and the irradiation is typically continued at least for 200 hours, and a longer evaluation time such as 400 hours may be partly introduced in the evaluation.

The reflectivity of the optical information recording medium before and after such irradiation was measured by a UV-visible spectrophotometer (V-570 manufactured by JASCO Corporation) at the read/write wavelengths of the next generation optical disk and the current DVD.

[Evaluation of Moist Heat Resistance]

Resistance to moist heat is evaluated by placing the optical information recording medium prepared under the same deposition conditions as the one used in evaluating the light resistance in the moist heat environment at a temperature of 80° C. and a humidity (relative humidity) of 90% for at least 200 hours.

In the case of the Ag alloy layer (reflective layer) having an average thickness of 15 nm (a semi-transparent layer), this change in the reflectivity (change in the absolute value of the reflectivity) of the optical information recording medium before and after the evaluation should be up to 2%, and preferably up to 1% when measured after keeping under hot moist conditions, and irradiated with a light beam at a wavelength of 405 nm, and this change in the reflectivity is used for the criteria in evaluating the environmental resistance of the present invention. When the evaluation is conducted after keeping under hot moist conditions, and irradiated with a light beam at a wavelength of 650 nm, the change in the reflectivity used as a criteria in evaluating the environmental resistance of the present invention should be up to 1%, and the change is preferably up to 0.5%.

In the case of a relatively thick Ag alloy layer (reflective layer) having an average thickness of 60 nm (a total reflection layer), this change in the reflectivity of the optical information recording medium before and after the evaluation should be up to 1%, and preferably up to 0.5% when measured after keeping under hot moist conditions, and irradiated with a light beam at a wavelength of 405 nm, and this change in the reflectivity is used for the criteria in evaluating the moist heat resistance of the present invention. When the evaluation is conducted after keeping under hot moist conditions, and irradiated with a light beam at a wavelength of 650 nm, the change in the reflectivity used as a criteria in evaluating the environmental resistance of the present invention should be up to 0.5%, and the change is preferably up to 0.3%.

As in the case of the evaluation of the light resistance, the reflectivity of the optical information recording medium before and after such irradiation under the moist heat conditions was measured by a UV-visible spectrophotometer (V-570 manufactured by JASCO Corporation) at the read/write wavelengths of the next generation optical disk and the current DVD.

[Conditions of Other Evaluation]

The evaluation of the light resistance and the moist heat resistance are preferably conducted by using the same test sample of the optical information recording medium. In view of the reproducibility, the substrate used in the evaluation is preferably the same as the substrate used in the intended optical information recording medium (optical disk), and this applies not only to the type of the substrate but also to the thickness and diameter of the substrate. For example, in the case of the polycarbonate substrate which is widely used in the optical information recording medium, the thickness and the diameter may be those widely used in the optical medium, namely, a thickness of 0.6 to 1.1 mm and a diameter of 8 to 12 cm.

In view of the reproducibility, the UV curable resin layer formed on the Ag alloy reflective layer in contact with the Ag alloy reflective layer is also the one including the resin used in the UV curable resin layer of the intended optical information recording medium (optical disk), and this applies not only to the type of the UV curable resin but also to the thickness of the layer. For example, the thickness may be in the range of 30 to 120 μm which is the typical thickness of the polycarbonate substrate of a read only optical disk.

[Initial Reflectivity: Basic Property]

The optical information recording medium (optical disk) intended in the present invention should have the environmental resistance as described above. The medium, however, should also have the basic properties required for an optical information recording medium such as high initial reflectivity, and the reflective layer of the present invention should also fulfill the requirement of such high initial reflectivity.

The initial reflectivity of an optical information recording medium is evaluated by measuring absolute reflectivity with a UV-visible spectrophotometer (V-570 manufactured by JASCO Corporation) at the wavelength used in reading the currently used DVD and the wavelength used in reading the next generation DVD. These reflectivity are used as the initial reflectivity of the Ag alloy reflective layer.

With regard to the thus measured initial reflectivity for the Ag alloy reflective layer of the present invention, at least 20% is used for the criteria in the case of the Ag alloy layer (reflective layer) having an average thickness of 15 nm (a semi-transparent layer) when measured with the light beam at a wavelength of 405 nm wavelength, and at least 58% is used for the criteria when measured with the light beam at a wavelength of 650 nm. With regard to the initial reflectivity for the relatively thick Ag alloy layer (reflective layer) having an average thickness of 60 nm (a total reflection layer), at least 77% is used for the criteria when measured with the light beam at a wavelength of 405 nm, and at least 90% is used for the criteria when measured with the light beam at a wavelength of 650 nm.

EXAMPLES

Next, the present invention is described in further detail by referring to the Examples. The Ag—X alloy layers shown in the Tables 1 to 8 were respectively deposited on the polycarbonate resin substrate by sputtering using a DC magnetron, and a UV curable resin layer was formed on this Ag—X alloy layer. The thus prepared samples were used for evaluation of the durability. The results of are shown in Tables 1 to 8 separately for the Examples and the Comparative Examples.

Composition of the Ag—X Alloy Layer:

Composition of the Ag—X alloy layer shown in the tables is the one analyzed by inductively coupled plasma mass spectroscopy (ICP-MS). More specifically, the Ag alloy layer was used for the analyte, and this Ag alloy layer was dissolved in an acidic solution (nitric acid:pure water=1:1). This acidic solution was heated at temperature of 200° C. on a hot plate, and after confirming the complete dissolution of the analyte, the solution was cooled to room temperature and analyzed by ICP mass spectrometer (SPQ-8000 manufactured by Seiko Instruments Inc.) to measure content of the elements in the Ag alloy layer.

Deposition of the Ag—X Alloy Layer:

In all Examples, the substrate used was the one having a thickness of 0.6 mm and a diameter of 12 cm. The target used in the sputtering was prepared by melting to have the same composition as the Ag—X alloy layers shown in Tables 1 and 2. The Ag—X alloy layer was deposited to an average thickness of 15 nm, and overlaid with a layer of a commercially available resin (SK6500 manufactured by Sony Chemical) to a thickness of 50 μm (micron). The resin layer was in contact with the Ag—X alloy layer, and the resulting laminate was used for evaluating the light resistance and the moist heat resistance.

The Ag—X alloy layer was deposited by a DC magnetron sputtering apparatus (Cube Star manufactured by Unaxis) at the substrate temperature of 22° C., Ar gas pressure of 2 mTorr, a deposition power density of 1 w/cm$^2$, and a back pressure of up to $5\times10^{-6}$ Torr, and the conditions used were the same for all Examples. The thickness of the layer was controlled by the time of the layer deposition.

The initial reflectivity (ratio (%) of the reflectivity of the Ag alloy layer to that of the pure Ag reflective layer) and the light resistance and the moist heat resistance in terms of the reflectivity (change (%) in the reflectivity before and after the evaluation) were measured by the procedure as described below.

Initial Reflectivity:

In the evaluation of the initial reflectivity shown in Tables 1, 3, 5, and 7, the Ag alloy layer (reflective layer) having an average thickness of 15 nm (semi-transparent layer) was irradiated with a light beam at a wavelength of 405 nm or 650 nm. When irradiated with a light beam at a wavelength of 405 nm, the reflective layer with the initial reflectivity of not less than 20% was evaluated "B" and the one with the initial reflectivity of less than 20% was evaluated "C". When irradiated with a light beam at a wavelength of 650 nm, the reflective layer with the initial reflectivity of not less than 58% was evaluated "B" and the one with the initial reflectivity of less than 58% was evaluated "C".

In the evaluation of the initial reflectivity shown in Tables 2, 4, 6, and 8, the relatively thick Ag alloy layer (reflective layer) having an average thickness of 60 nm (total reflection layer) was irradiated with a light beam at a wavelength of 405 nm or 650 nm. When irradiated with a light beam at a wavelength of 405 nm, the reflective layer with the initial reflectivity of not less than 77% was evaluated "B" and the one with the initial reflectivity of less than 77% was evaluated "C". When irradiated with a light beam at a wavelength of 650 nm, the reflective layer with the initial reflectivity of not less than 90% was evaluated "B" and the one with the initial reflectivity of less than 90% was evaluated "C".

Light Resistance:

In the evaluation of the light resistance shown in Tables 1 and 3, the Ag alloy layer (reflective layer) having an average thickness of 15 nm (semi-transparent layer) was irradiated with a light beam at a wavelength of 405 nm or with a light beam at a wavelength of 650 nm. When irradiated with a light beam at a wavelength of 405 nm, the reflective layer with change in the reflectivity after 400 hours of not more than 2% was evaluated "A", the one with the change in the range of more than 2% to not more than 3.5% was evaluated "B", and the one with the change in excess of 3.5% was evaluated "C". When irradiated with a light beam at a wavelength of 650 nm, the reflective layer with change in the reflectivity after 400 hours of not more than 1% was evaluated "A", the one with the change in the range of more than 1% to not more than 1.5% was evaluated "B", and the one with the change in excess of 1.5% was evaluated "C".

In the evaluation of the light resistance shown in Tables 2 and 4, the relatively thick Ag alloy layer (reflective layer) having an average thickness of 60 nm (total reflection layer) was irradiated with a light beam at a wavelength of 405 nm or with a light beam at a wavelength of 650 nm. When irradiated with a light beam at a wavelength of 405 nm, the reflective layer with change in the reflectivity after 400 hours of not more than 1% was evaluated "A", the one with the change in the range of more than 1% to not more than 3% was evaluated "B", and the one with the change in excess of 3% was evaluated "C". When irradiated with a light beam at a wavelength of 650 nm, the reflective layer with change in the reflectivity after 400 hours of not more than 0.5% was evaluated "A", the one with the change in the range of more than 0.5% to not more than 1% was evaluated "B", and the one with the change in excess of 1% was evaluated "C".

Resistance to Moist Heat:

In the evaluation of the moist heat resistance shown in Tables 5 and 7, the Ag alloy layer (reflective layer) having an average thickness of 15 nm (semi-transparent layer) was kept under hot moist conditions for 200 hours, and irradiated with a light beam at a wavelength of 405 nm or with a light beam at a wavelength of 650 nm. When irradiated at 405 nm, the reflective layer with change in the reflectivity after 200 hours of not more than 1% was evaluated "A", the one with the change in the range of more than 1% to not more than 2% was evaluated "B", and the one with the change in excess of 2% was evaluated "C". When irradiated at 650 nm, the reflective layer with change in the reflectivity after 200 hours of not more than 0.5% was evaluated "A", the one with the change in the range of more than 0.5% to not more than 1% was evaluated "B", and the one with the change in excess of 1% was evaluated "C".

In the evaluation of the moist heat resistance shown in Tables 6 and 8, the relatively thick Ag alloy layer (reflective layer) having an average thickness of 60 nm (total reflection layer) was kept under hot moist conditions for 200 hours, and irradiated with a light beam at a wavelength of 405 nm or with a light beam at a wavelength of 650 nm. When irradiated at 405 nm, the reflective layer with change in the reflectivity after 200 hours of not more than 0.5% was evaluated "A", the one with the change in the range of more than 0.5% to not more than 1% was evaluated "B", and the one with the change in excess of 1% was evaluated "C". When irradiated at 650 nm, the reflective layer with change in the reflectivity after 200 hours of not more than 0.3% was evaluated "A", the one with the change in the range of more than 0.3% to not more than 0.5% was evaluated "B", and the one with the change in excess of 0.5% was evaluated "C".

The reflective layers of the Examples 1 to 28 shown in Tables 1, 2, 5, and 6 contain the W, Ti, V, Mn, Zr, Cr, and/or Ni and the Bi at a content within the scope of the present invention, and same Example No. corresponds to the same composition. The reflective layers of the of Comparative Examples 30 to 43 of Tables 3, 4, 7, and 8 contain the W, Ti, V, Mn, Zr, Cr, and Ni either at an excessively low content or at an excessively high content, and same Comparative Example No. corresponds to the same composition. The reflective layers of the of Comparative Examples 44 and 45 shown in Tables 3, 4, 7, and 8 do not contain the W, Ti, V, Mn, Zr, Cr, and Ni, but contain rare earth elements such as Nd and Y at the predetermined content. The reflective layer of Comparative Example 46 shown in Tables 3, 4, 7, and 8 has Ag reflective layer containing Li corresponding to the Japanese Patent Application Laid-Open No. 2006-48899 (Patent Document 5).

As evident from comparing the Examples 1 to 28 of Tables 1 and 2 and the Comparative Examples 29 to 46 of Tables 3 and 4, and comparing the Examples 1 to 28 of Tables 5 and 6 and the Comparative Examples 29 to 46 of Tables 7 and 8, the reflective layers of the Examples are superior in the environmental resistance compared to those of the Comparative Examples. More specifically, the Examples containing the W, Ti, V, Mn, Zr, Cr, and/or Ni as the critical component and at the predetermined amount of the present invention exhibit superior environmental resistance compared to the Comparative Examples as confirmed by the reduced change of the reflectivity in the evaluation of the light resistance and the moist heat resistance although initial reflectivity is equivalent.

The reflective layers of the Examples also exhibited excellent environmental resistance as demonstrated by the evaluation of the light resistance and the moist heat resistance for 200 hours, and in particular, by the evaluation of the light resistance for as long as 400 hours. These excellent results were common for the semi-transparent layer having an average thickness of 15 nm and the total reflection layer having an average thickness of 60 nm, and for the irradiation of the light beams of different wavelength, namely, the light beams at a wavelength of 405 nm and 650 nm.

Accordingly, the results of the Examples confirm that, in the Ag alloy reflective layers of Examples 1 to 28, the deterioration of the mode caused by the dispersion of the Ag from the reflective layer to the adjacent UV curable resin layer and aggregation therein is suppressed to realize improvement in the environmental resistance including the moist heat resistance and the light resistance which is maintained at a high level for a prolonged period. Also confirmed is the importance of selecting the type and content of the alloying components of the reflective layer, namely, the W, Ti, V, Mn, Zr, Cr, and/or Ni of the present invention in consideration of maintaining the environmental resistance of the reflective layer for prolonged time.

In contrast, either the initial reflectivity or the environmental resistance was inferior in the Comparative Examples. The pure Ag reflective layer of Comparative Example 29 exhibited high initial reflectivity but inferior environmental resistance. Comparative Examples 30, 32, and 34 exhibited poor environmental resistance because of the excessive low content of the Bi. Comparative Examples 31, 33, and 35 exhibited inferior initial reflectivity and environmental resistance due to the excessively high content of the Bi. Comparative Examples 36, 38, 40, and 42 were inferior in the environmental resistance because of the excessively low content of the W, Ti, V, Mn, Zr, Cr, and/or Ni. Comparative Examples 37, 39, 41, and 43 were poor in both the initial reflectivity and the environmental resistance due to the excessively high content of the W, Ti, V, Mn, Zr, Cr, and/or Ni. Comparative Examples 44 and 45 were insufficient in the environmental resistance although the initial reflectivity was acceptable because of the incorporation of the Gd and Nd in addition to the Bi.

As described above, the results of the Examples confirmed that, in the Ag alloy reflective layer of the present invention, the deterioration of the mode caused by the dispersion of the Ag in the reflective layer to the adjacent UV curable resin layer and aggregation in the UV curable resin layer is suppressed, and this results in the improvement of the environmental resistance including both the moist heat resistance and the light resistance, and maintenance of such environmental resistance for a prolonged period. The results of the Examples also confirmed the importance of incorporating the Bi and the W, Ti, V, Mn, Zr, Cr, and/or Ni in the Ag alloy reflective layer of the present invention, and limiting the lower and the upper limit, namely, the range of the content or the total content of such elements.

TABLE 1

| Category | No. | Ag reflective layer (average thickness, 15 nm) Composition (atomic %, the residue being Ag) | Light resistance of the reflective layer 1 (wavelength, 405 nm) | | | | |
|---|---|---|---|---|---|---|---|
| | | | Initial reflectivity (%) | Evaluation result | Change in reflectivity (after 200 hours) | Change in reflectivity (after 400 hours) | Evaluation result (after 400 hours) |
| Example | 1 | Ag—0.005Bi—1W | 21.8 | B | 1.85 | 2.83 | B |
| | 2 | Ag—0.05Bi—1W | 21.6 | B | 1.75 | 2.65 | B |
| | 3 | Ag—0.5Bi—1W | 21.5 | B | 1.82 | 2.33 | B |
| | 4 | Ag—1.0Bi—1W | 21.2 | B | 1.67 | 2.24 | B |
| | 5 | Ag—0.5Bi—0.1W | 21.9 | B | 1.72 | 2.87 | B |
| | 6 | Ag—0.5Bi—0.5W | 21.4 | B | 1.67 | 2.60 | B |
| | 7 | Ag—0.5Bi—3.0W | 20.9 | B | 1.42 | 2.48 | B |
| | 8 | Ag—0.5Bi—5.0W | 20.7 | B | 1.23 | 2.12 | B |
| | 9 | Ag—0.005Bi—1Ti | 21.7 | B | 1.72 | 2.69 | B |
| | 10 | Ag—0.05Bi—1Ti | 21.6 | B | 1.75 | 2.65 | B |
| | 11 | Ag—0.5Bi—1Ti | 21.4 | B | 1.76 | 2.51 | B |
| | 12 | Ag—1.0Bi—1Ti | 21.1 | B | 1.81 | 2.32 | B |
| | 13 | Ag—0.5Bi—0.1Ti | 22.0 | B | 1.68 | 2.88 | B |
| | 14 | Ag—0.5Bi—0.5Ti | 21.5 | B | 1.77 | 2.40 | B |
| | 15 | Ag—0.5Bi—3.0Ti | 21.1 | B | 1.40 | 2.38 | B |
| | 16 | Ag—0.5Bi—5.0Ti | 20.5 | B | 1.29 | 2.12 | B |
| | 17 | Ag—0.5Bi—1V | 21.3 | B | 1.81 | 2.35 | B |
| | 18 | Ag—0.5Bi—1Mn | 21.5 | B | 1.74 | 2.29 | B |
| | 19 | Ag—0.5Bi—1Zr | 21.8 | B | 1.68 | 2.56 | B |
| | 20 | Ag—0.5Bi—1Cr | 21.5 | B | 1.77 | 2.34 | B |
| | 21 | Ag—0.5Bi—1Ni | 21.3 | B | 1.69 | 2.26 | B |
| | 22 | Ag—0.5Bi—0.5W—0.5Ti | 21.4 | B | 1.57 | 1.98 | A |
| | 23 | Ag—0.5Bi—0.5V—0.5Mn | 21.1 | B | 1.62 | 1.92 | A |
| | 24 | Ag—0.5Bi—0.5Zr—0.5Cr | 21.2 | B | 1.65 | 1.95 | A |
| | 25 | Ag—0.5Bi—0.5Ni—0.5Zr—0.5Cr | 21.2 | B | 1.69 | 1.90 | A |
| | 26 | Ag—0.5Bi—0.5W—0.5V—0.5Zr | 21.4 | B | 1.58 | 1.86 | A |
| | 27 | Ag—0.5Bi—0.5Ti—0.5Mn—0.5Cr—0.5W | 21.1 | B | 1.89 | 1.82 | A |
| | 28 | Ag—0.5Bi—0.5V—0.5Mn—0.5Zr—0.5Cr—0.5W | 21.1 | B | 1.43 | 1.77 | A |

| Category | No. | Light resistance of the reflective layer 2 (wavelength, 650 nm) | | | | | Overall evaluation result |
|---|---|---|---|---|---|---|---|
| | | Initial reflectivity (%) | Evaluation result | Change in reflectivity (after 200 hours) | Change in reflectivity (after 400 hours) | Evaluation result (after 400 hours) | |
| Example | 1 | 59.5 | B | 0.99 | 1.42 | B | B |
| | 2 | 59.7 | B | 0.94 | 1.32 | B | B |
| | 3 | 59.4 | B | 0.97 | 1.22 | B | B |
| | 4 | 59.1 | B | 0.85 | 1.15 | B | B |
| | 5 | 59.6 | B | 0.93 | 1.48 | B | B |
| | 6 | 59.7 | B | 0.90 | 1.42 | B | B |
| | 7 | 58.7 | B | 1.08 | 1.35 | B | B |
| | 8 | 58.2 | B | 1.00 | 1.21 | B | B |
| | 9 | 59.8 | B | 0.94 | 1.44 | B | B |
| | 10 | 59.6 | B | 0.95 | 1.42 | B | B |
| | 11 | 59.4 | B | 0.94 | 1.43 | B | B |
| | 12 | 58.9 | B | 1.05 | 1.43 | B | B |
| | 13 | 59.8 | B | 1.13 | 1.48 | B | B |
| | 14 | 59.7 | B | 0.90 | 1.43 | B | B |
| | 15 | 58.8 | B | 0.92 | 1.25 | B | B |
| | 16 | 58.2 | B | 0.89 | 1.08 | B | B |
| | 17 | 59.3 | B | 0.92 | 1.42 | B | B |
| | 18 | 58.6 | B | 0.97 | 1.44 | B | B |
| | 19 | 59.0 | B | 1.10 | 1.45 | B | B |
| | 20 | 59.6 | B | 0.86 | 1.41 | B | B |
| | 21 | 58.6 | B | 0.99 | 1.40 | B | B |
| | 22 | 59.7 | B | 1.01 | 0.95 | A | A |
| | 23 | 59.1 | B | 0.93 | 0.97 | A | A |
| | 24 | 59.1 | B | 1.10 | 0.87 | A | A |
| | 25 | 59.3 | B | 0.94 | 0.89 | A | A |
| | 26 | 59.4 | B | 0.99 | 0.95 | A | A |
| | 27 | 58.7 | B | 1.01 | 0.84 | A | A |
| | 28 | 58.6 | B | 1.03 | 0.79 | A | A |

TABLE 2

| Category | No. | Ag reflective layer (average thickness, 60 nm) Composition (atomic %, the residue being Ag) | Light resistance of the reflective layer 1 (wavelength, 405 nm) | | | | |
|---|---|---|---|---|---|---|---|
| | | | Initial reflectivity (%) | Evaluation result | Change in reflectivity (after 200 hours) | Change in reflectivity (after 400 hours) | Evaluation result (after 400 hours) |
| Example | 1 | Ag—0.005Bi—1W | 79.5 | B | 0.64 | 2.09 | B |
| | 2 | Ag—0.05Bi—1W | 79.1 | B | 0.78 | 1.95 | B |
| | 3 | Ag—0.5Bi—1W | 79.5 | B | 0.78 | 1.91 | B |
| | 4 | Ag—1.0Bi—1W | 79.7 | B | 0.71 | 1.75 | B |
| | 5 | Ag—0.5Bi—0.1W | 79.7 | B | 0.68 | 2.07 | B |
| | 6 | Ag—0.5Bi—0.5W | 79.3 | B | 0.65 | 1.99 | B |
| | 7 | Ag—0.5Bi—3.0W | 78.5 | B | 0.63 | 1.23 | B |
| | 8 | Ag—0.5Bi—5.0W | 78.2 | B | 0.57 | 1.06 | B |
| | 9 | Ag—0.005Bi—1Ti | 79.5 | B | 0.72 | 1.97 | B |
| | 10 | Ag—0.05Bi—1Ti | 79.1 | B | 0.70 | 1.95 | B |
| | 11 | Ag—0.5Bi—1Ti | 79.7 | B | 0.69 | 1.67 | B |
| | 12 | Ag—1.0Bi—1Ti | 79.3 | B | 0.79 | 1.55 | B |
| | 13 | Ag—0.5Bi—0.1Ti | 79.1 | B | 0.73 | 1.91 | B |
| | 14 | Ag—0.5Bi—0.5Ti | 79.4 | B | 0.64 | 1.85 | B |
| | 15 | Ag—0.5Bi—3.0Ti | 78.4 | B | 0.66 | 1.35 | B |
| | 16 | Ag—0.5Bi—5.0Ti | 78.1 | B | 0.58 | 1.05 | B |
| | 17 | Ag—0.5Bi—1V | 79.6 | B | 0.69 | 2.07 | B |
| | 18 | Ag—0.5Bi—1Mn | 79.7 | B | 0.80 | 1.95 | B |
| | 19 | Ag—0.5Bi—1Zr | 79.2 | B | 0.62 | 1.86 | B |
| | 20 | Ag—0.5Bi—1Cr | 79.7 | B | 0.78 | 1.75 | B |
| | 21 | Ag—0.5Bi—1Ni | 79.1 | B | 0.63 | 1.69 | B |
| | 22 | Ag—0.5Bi—0.5W—0.5Ti | 79.7 | B | 0.61 | 0.95 | A |
| | 23 | Ag—0.5Bi—0.5V—0.5Mn | 79.2 | B | 0.59 | 0.95 | A |
| | 24 | Ag—0.5Bi—0.5Zr—0.5Cr | 79.1 | B | 0.58 | 0.95 | A |
| | 25 | Ag—0.5Bi—0.5Ni—0.5Zr—0.5Cr | 79.2 | B | 0.57 | 0.90 | A |
| | 26 | Ag—0.5Bi—0.5W—0.5V—0.5Zr | 79.6 | B | 0.55 | 0.80 | A |
| | 27 | Ag—0.5Bi—0.5Ti—0.5Mn—0.5Cr—0.5W | 78.8 | B | 0.54 | 0.95 | A |
| | 28 | Ag—0.5Bi—0.5V—0.5Mn—0.5Zr—0.5Cr—0.5W | 78.7 | B | 0.52 | 0.85 | A |

| Category | No. | Light resistance of the reflective layer 2 (wavelength, 650 nm) | | | | | Overall evaluation result |
|---|---|---|---|---|---|---|---|
| | | Initial reflectivity (%) | Evaluation result | Change in reflectivity (after 200 hours) | Change in reflectivity (after 400 hours) | Evaluation result (after 400 hours) | |
| Example | 1 | 93.7 | B | 0.23 | 0.87 | B | B |
| | 2 | 92.8 | B | 0.26 | 0.82 | B | B |
| | 3 | 93.7 | B | 0.28 | 0.76 | B | B |
| | 4 | 92.7 | B | 0.26 | 0.73 | B | B |
| | 5 | 94.3 | B | 0.28 | 0.87 | B | B |
| | 6 | 93.7 | B | 0.27 | 0.86 | B | B |
| | 7 | 93.4 | B | 0.26 | 0.76 | B | B |
| | 8 | 91.4 | B | 0.26 | 0.72 | B | B |
| | 9 | 93.0 | B | 0.36 | 0.87 | B | B |
| | 10 | 93.5 | B | 0.19 | 0.60 | B | B |
| | 11 | 93.7 | B | 0.27 | 0.82 | B | B |
| | 12 | 94.2 | B | 0.25 | 0.84 | B | B |
| | 13 | 93.1 | B | 0.14 | 0.81 | B | B |
| | 14 | 94.0 | B | 0.15 | 0.87 | B | B |
| | 15 | 92.8 | B | 0.14 | 0.85 | B | B |
| | 16 | 91.5 | B | 0.25 | 0.77 | B | B |
| | 17 | 94.5 | B | 0.27 | 0.85 | B | B |
| | 18 | 93.9 | B | 0.32 | 0.87 | B | B |
| | 19 | 93.5 | B | 0.25 | 0.82 | B | B |
| | 20 | 94.4 | B | 0.28 | 0.81 | B | B |
| | 21 | 93.3 | B | 0.30 | 0.79 | B | B |
| | 22 | 93.5 | B | 0.23 | 0.49 | A | A |
| | 23 | 93.2 | B | 0.26 | 0.45 | A | A |
| | 24 | 93.2 | B | 0.32 | 0.44 | A | A |
| | 25 | 93.2 | B | 0.21 | 0.43 | A | A |
| | 26 | 93.6 | B | 0.25 | 0.44 | A | A |
| | 27 | 93.1 | B | 0.21 | 0.39 | A | A |
| | 28 | 93.0 | B | 0.17 | 0.38 | A | A |

TABLE 3

| Category | No. | Ag reflective layer (average thickness, 15 nm) Composition (atomic %, the residue being Ag) | Light resistance of the reflective layer 1 (wavelength, 405 nm) | | | | |
|---|---|---|---|---|---|---|---|
| | | | Initial reflectivity (%) | Evaluation result | Change in reflectivity (after 200 hours) | Change in reflectivity (after 400 hours) | Evaluation result (after 400 hours) |
| Comparative Example | 29 | Pure Ag | 22.8 | B | 2.13 | 6.23 | C |
| | 30 | Ag—0.003Bi—1W | 21.5 | B | 1.59 | 4.43 | C |
| | 31 | Ag—1.5 Bi—1W | 21.3 | B | 1.73 | 4.38 | C |
| | 32 | Ag—0.003Bi—1Ti | 21.9 | B | 1.75 | 4.42 | C |
| | 33 | Ag—1.5 Bi—1Ti | 21.4 | B | 1.65 | 4.54 | C |
| | 34 | Ag—0.003Bi—1V | 21.5 | B | 1.68 | 4.48 | C |
| | 35 | Ag—1.5 Bi—1V | 21.4 | B | 1.57 | 4.37 | C |
| | 36 | Ag—0.5Bi—0.04W | 22.4 | B | 1.66 | 4.52 | C |
| | 37 | Ag—0.5Bi—7.0W | 18.4 | C | 1.12 | 2.75 | B |
| | 38 | Ag—0.5Bi—0.04Ti | 22.3 | B | 1.60 | 4.41 | C |
| | 39 | Ag—0.5Bi—7.0Ti | 19.0 | C | 1.02 | 2.88 | B |
| | 40 | Ag—0.5Bi—0.04V | 22.1 | B | 1.55 | 4.55 | C |
| | 41 | Ag—0.5Bi—7.0V | 18.9 | C | 1.05 | 2.94 | B |
| | 42 | Ag—0.5Bi—0.04Mn | 22.4 | B | 1.70 | 4.38 | C |
| | 43 | Ag—0.5Bi—7.0Mn | 18.5 | C | 1.09 | 2.79 | B |
| | 44 | Ag—0.5Bi—1Nd | 21.4 | B | 1.60 | 4.39 | C |
| | 45 | Ag—0.5Bi—1Gd | 21.5 | B | 1.68 | 4.46 | C |
| | 46 | Ag—3Li | 21.7 | B | 1.16 | 3.89 | C |

| Category | No. | Light resistance of the reflective layer 2 (wavelength, 650 nm) | | | | | Overall evaluation result |
|---|---|---|---|---|---|---|---|
| | | Initial reflectivity (%) | Evaluation result | Change in reflectivity (after 200 hours) | Change in reflectivity (after 400 hours) | Evaluation result (after 400 hours) | |
| Comparative Example | 29 | 60.7 | B | 1.62 | 2.89 | C | C |
| | 30 | 59.5 | B | 1.12 | 1.55 | C | C |
| | 31 | 59.4 | B | 1.05 | 1.52 | C | C |
| | 32 | 59.6 | B | 1.17 | 1.52 | C | C |
| | 33 | 59.3 | B | 1.20 | 1.50 | C | C |
| | 34 | 59.8 | B | 1.05 | 1.51 | C | C |
| | 35 | 59.2 | B | 1.12 | 1.55 | C | C |
| | 36 | 60.1 | B | 1.32 | 1.85 | C | C |
| | 37 | 57.3 | C | 0.84 | 1.48 | B | C |
| | 38 | 60.2 | B | 1.25 | 1.79 | C | C |
| | 39 | 57.2 | C | 0.87 | 1.45 | B | C |
| | 40 | 60.1 | B | 1.28 | 1.91 | C | C |
| | 41 | 57.6 | C | 0.94 | 1.39 | B | C |
| | 42 | 60.0 | B | 1.31 | 1.74 | C | C |
| | 43 | 57.3 | C | 0.95 | 1.37 | B | C |
| | 44 | 59.2 | B | 1.05 | 1.54 | C | C |
| | 45 | 59.8 | B | 1.08 | 1.65 | C | C |
| | 46 | 58.1 | B | 0.75 | 1.66 | C | C |

TABLE 4

| Category | No. | Ag reflective layer (average thickness, 60 nm) Composition (atomic %, the residue being Ag) | Light resistance of the reflective layer 1 (wavelength, 405 nm) | | | | |
|---|---|---|---|---|---|---|---|
| | | | Initial reflectivity (%) | Evaluation result | Change in reflectivity (after 200 hours) | Change in reflectivity (after 400 hours) | Evaluation result (after 400 hours) |
| Comparative Example | 29 | Pure Ag | 80.8 | B | 1.05 | 4.81 | C |
| | 30 | Ag—0.003Bi—1W | 79.5 | B | 0.73 | 3.58 | C |
| | 31 | Ag—1.5 Bi—1W | 79.4 | B | 0.71 | 3.25 | C |
| | 32 | Ag—0.003Bi—1Ti | 79.1 | B | 0.72 | 3.23 | C |
| | 33 | Ag—1.5 Bi—1Ti | 79.5 | B | 0.72 | 3.21 | C |
| | 34 | Ag—0.003Bi—1V | 79.1 | B | 0.70 | 3.41 | C |
| | 35 | Ag—1.5 Bi—1V | 79.4 | B | 0.76 | 3.37 | C |
| | 36 | Ag—0.5Bi—0.04W | 79.5 | B | 0.79 | 3.62 | C |
| | 37 | Ag—0.5Bi—7.0W | 76.3 | C | 0.55 | 2.57 | B |

TABLE 4-continued

| | | | | | | |
|---|---|---|---|---|---|---|
| | 38 | Ag—0.5Bi—0.04Ti | 79.7 | B | 0.75 | 3.75 | C |
| | 39 | Ag—0.5Bi—7.0Ti | 75.8 | C | 0.54 | 2.69 | B |
| | 40 | Ag—0.5Bi—0.04V | 79.5 | B | 0.76 | 3.65 | C |
| | 41 | Ag—0.5Bi—7.0V | 76.4 | C | 0.52 | 2.71 | B |
| | 42 | Ag—0.5Bi—0.04Mn | 79.8 | B | 0.77 | 3.59 | C |
| | 43 | Ag—0.5Bi—7.0Mn | 76.7 | C | 0.57 | 2.59 | B |
| | 44 | Ag—0.5Bi—1Nd | 79.1 | B | 0.60 | 3.15 | C |
| | 45 | Ag—0.5Bi—1Gd | 78.8 | B | 0.79 | 3.21 | C |
| | 46 | Ag—3Li | 78.9 | B | 0.55 | 1.24 | B |

| | | Light resistance of the reflective layer 2 (wavelength, 650 nm) | | | | | |
|---|---|---|---|---|---|---|---|
| Category | No. | Initial reflectivity (%) | Evaluation result | Change in reflectivity (after 200 hours) | Change in reflectivity (after 400 hours) | Evaluation result (after 400 hours) | Overall evaluation result |
| Comparative Example | 29 | 95.5 | B | 0.26 | 2.06 | C | C |
| | 30 | 93.7 | B | 0.30 | 1.53 | C | C |
| | 31 | 93.4 | B | 0.30 | 1.32 | C | C |
| | 32 | 93.8 | B | 0.28 | 1.51 | C | C |
| | 33 | 94.4 | B | 0.30 | 1.53 | C | C |
| | 34 | 92.6 | B | 0.31 | 1.84 | C | C |
| | 35 | 93.2 | B | 0.25 | 1.39 | C | C |
| | 36 | 92.9 | B | 0.29 | 1.76 | C | C |
| | 37 | 89.7 | C | 0.34 | 0.79 | B | C |
| | 38 | 94.0 | B | 0.23 | 1.87 | C | C |
| | 39 | 89.6 | C | 0.25 | 0.86 | B | C |
| | 40 | 92.9 | B | 0.26 | 1.82 | C | C |
| | 41 | 89.7 | C | 0.17 | 0.84 | B | C |
| | 42 | 92.8 | B | 0.21 | 1.79 | C | C |
| | 43 | 89.5 | C | 0.15 | 0.72 | B | C |
| | 44 | 92.7 | B | 0.26 | 1.53 | C | C |
| | 45 | 93.1 | B | 0.29 | 1.45 | C | C |
| | 46 | 93.2 | B | 0.24 | 1.13 | C | C |

TABLE 5

| | | | Moist heat resistance of the reflective layer 1 (wavelength, 405 nm) | | | | Moist heat resistance of the reflective layer 2 (wavelength, 650 nm) | | | | |
|---|---|---|---|---|---|---|---|---|---|---|---|
| Category | No. | Ag reflective layer (average thickness, 15 nm) Composition (atomic %, the residue being Ag) | Initial reflectivity (%) | Evaluation result | Change in reflectivity (after 200 hours) | Evaluation result | Initial reflectivity (%) | Evaluation result | Change in reflectivity (after 200 hours) | Evaluation result | Overall evaluation result |
| Example | 1 | Ag—0.005Bi—1W | 21.8 | B | 1.88 | B | 59.5 | B | 0.90 | B | B |
| | 2 | Ag—0.05Bi—1W | 21.6 | B | 1.87 | B | 59.7 | B | 0.88 | B | B |
| | 3 | Ag—0.5Bi—1W | 21.5 | B | 1.65 | B | 59.4 | B | 0.95 | B | B |
| | 4 | Ag—1.0Bi—1W | 21.2 | B | 1.45 | B | 59.1 | B | 0.75 | B | B |
| | 5 | Ag—0.5Bi—0.1W | 21.9 | B | 1.93 | B | 59.6 | B | 0.85 | B | B |
| | 6 | Ag—0.5Bi—0.5W | 21.4 | B | 1.87 | B | 59.7 | B | 0.72 | B | B |
| | 7 | Ag—0.5Bi—3.0W | 20.9 | B | 1.66 | B | 58.7 | B | 0.57 | B | B |
| | 8 | Ag—0.5Bi—5.0W | 20.7 | B | 1.45 | B | 58.2 | B | 0.64 | B | B |
| | 9 | Ag—0.005Bi—1Ti | 21.7 | B | 1.87 | B | 59.8 | B | 0.60 | B | B |
| | 10 | Ag—0.05Bi—1Ti | 21.6 | B | 1.76 | B | 59.6 | B | 0.57 | B | B |
| | 11 | Ag—0.5Bi—1Ti | 21.4 | B | 1.63 | B | 59.4 | B | 0.87 | B | B |
| | 12 | Ag—1.0Bi—1Ti | 21.1 | B | 1.43 | B | 58.9 | B | 0.53 | B | B |
| | 13 | Ag—0.5Bi—0.1Ti | 22.0 | B | 1.76 | B | 59.8 | B | 0.88 | B | B |
| | 14 | Ag—0.5Bi—0.5Ti | 21.5 | B | 1.66 | B | 59.7 | B | 0.99 | B | B |
| | 15 | Ag—0.5Bi—3.0Ti | 21.1 | B | 1.43 | B | 58.8 | B | 0.63 | B | B |
| | 16 | Ag—0.5Bi—5.0Ti | 20.5 | B | 1.31 | B | 58.2 | B | 0.75 | B | B |
| | 17 | Ag—0.5Bi—1V | 21.3 | B | 1.48 | B | 59.3 | B | 0.53 | B | B |
| | 18 | Ag—0.5Bi—1Mn | 21.5 | B | 1.39 | B | 58.6 | B | 0.75 | B | B |
| | 19 | Ag—0.5Bi—1Zr | 21.8 | B | 1.42 | B | 59.0 | B | 0.90 | B | B |
| | 20 | Ag—0.5Bi—1Cr | 21.5 | B | 1.45 | B | 59.6 | B | 0.96 | B | B |
| | 21 | Ag—0.5Bi—1Ni | 21.3 | B | 1.33 | B | 58.6 | B | 0.69 | B | B |
| | 22 | Ag—0.5Bi—0.5W—0.5Ti | 21.4 | B | 0.96 | A | 59.7 | B | 0.31 | A | A |
| | 23 | Ag—0.5Bi—0.5V—0.5Mn | 21.1 | B | 0.93 | A | 59.1 | B | 0.39 | A | A |
| | 24 | Ag—0.5Bi—0.5Zr—0.5Cr | 21.2 | B | 0.89 | A | 59.1 | B | 0.44 | A | A |

TABLE 5-continued

|  |  |  | Moist heat resistance of the reflective layer 1 (wavelength, 405 nm) | | | Moist heat resistance of the reflective layer 2 (wavelength, 650 nm) | | | |
|---|---|---|---|---|---|---|---|---|---|
| Category | No. | Ag reflective layer (average thickness, 15 nm) Composition (atomic %, the residue being Ag) | Initial reflectivity (%) | Evaluation result | Change in reflectivity (after 200 hours) | Evaluation result | Initial reflectivity (%) | Evaluation result | Change in reflectivity (after 200 hours) | Evaluation result | Overall evaluation result |
|  | 25 | Ag—0.5Bi—0.5Ni—0.5Zr—0.5Cr | 21.2 | B | 0.87 | A | 59.3 | B | 0.46 | A | A |
|  | 26 | Ag—0.5Bi—0.5W—0.5V—0.5Zr | 21.4 | B | 0.85 | A | 59.4 | B | 0.46 | A | A |
|  | 27 | Ag—0.5Bi—0.5Ti—0.5Mn—0.5Cr—0.5W | 21.1 | B | 0.84 | A | 58.7 | B | 0.35 | A | A |
|  | 28 | Ag—0.5Bi—0.5V—0.5Mn—0.5Zr—0.5Cr—0.5W | 21.1 | B | 0.81 | A | 58.6 | B | 0.34 | A | A |

TABLE 6

| Category | No. | Ag reflective layer (average thickness, 60 nm) Composition (atomic %, the residue being Ag) | Initial reflectivity (%) | Evaluation result | Change in reflectivity (after 200 hours) | Evaluation result | Initial reflectivity (%) | Evaluation result | Change in reflectivity (after 200 hours) | Evaluation result | Overall evaluation result |
|---|---|---|---|---|---|---|---|---|---|---|---|
| Example | 1 | Ag—0.005Bi—1W | 79.5 | B | 0.64 | B | 93.7 | B | 0.40 | B | B |
|  | 2 | Ag—0.05Bi—1W | 79.1 | B | 0.67 | B | 92.8 | B | 0.35 | B | B |
|  | 3 | Ag—0.5Bi—1W | 79.5 | B | 0.98 | B | 93.7 | B | 0.34 | B | B |
|  | 4 | Ag—1.0Bi—1W | 79.7 | B | 0.59 | B | 92.7 | B | 0.41 | B | B |
|  | 5 | Ag—0.5Bi—0.1W | 79.7 | B | 0.74 | B | 94.3 | B | 0.43 | B | B |
|  | 6 | Ag—0.5Bi—0.5W | 79.3 | B | 0.50 | B | 93.7 | B | 0.30 | B | B |
|  | 7 | Ag—0.5Bi—3.0W | 78.5 | B | 0.69 | B | 93.4 | B | 0.42 | B | B |
|  | 8 | Ag—0.5Bi—5.0W | 78.2 | B | 0.80 | B | 91.4 | B | 0.32 | B | B |
|  | 9 | Ag—0.005Bi—1Ti | 79.5 | B | 0.93 | B | 93.0 | B | 0.33 | B | B |
|  | 10 | Ag—0.05Bi—1Ti | 79.1 | B | 0.85 | B | 93.5 | B | 0.30 | B | B |
|  | 11 | Ag—0.5Bi—1Ti | 79.7 | B | 0.64 | B | 93.7 | B | 0.32 | B | B |
|  | 12 | Ag—1.0Bi—1Ti | 79.3 | B | 0.74 | B | 94.2 | B | 0.36 | B | B |
|  | 13 | Ag—0.5Bi—0.1Ti | 79.1 | B | 0.77 | B | 93.1 | B | 0.47 | B | B |
|  | 14 | Ag—0.5Bi—0.5Ti | 79.4 | B | 0.91 | B | 94.0 | B | 0.47 | B | B |
|  | 15 | Ag—0.5Bi—3.0Ti | 78.4 | B | 0.63 | B | 92.8 | B | 0.49 | B | B |
|  | 16 | Ag—0.5Bi—5.0Ti | 78.1 | B | 0.57 | B | 91.5 | B | 0.49 | B | B |
|  | 17 | Ag—0.5Bi—1V | 79.6 | B | 0.79 | B | 94.5 | B | 0.32 | B | B |
|  | 18 | Ag—0.5Bi—1Mn | 79.7 | B | 0.68 | B | 93.9 | B | 0.44 | B | B |
|  | 19 | Ag—0.5Bi—1Zr | 79.2 | B | 0.89 | B | 93.5 | B | 0.46 | B | B |
|  | 20 | Ag—0.5Bi—1Cr | 79.7 | B | 0.60 | B | 94.4 | B | 0.45 | B | B |
|  | 21 | Ag—0.5Bi—1Ni | 79.1 | B | 0.85 | B | 93.3 | B | 0.42 | B | B |
|  | 22 | Ag—0.5Bi—0.5W—0.5Ti | 79.7 | B | 0.41 | A | 93.5 | B | 0.23 | A | A |
|  | 23 | Ag—0.5Bi—0.5V—0.5Mn | 79.2 | B | 0.31 | A | 93.2 | B | 0.24 | A | A |
|  | 24 | Ag—0.5Bi—0.5Zr—0.5Cr | 79.1 | B | 0.37 | A | 93.2 | B | 0.28 | A | A |
|  | 25 | Ag—0.5Bi—0.5Ni—0.5Zr—0.5Cr | 79.2 | B | 0.35 | A | 93.2 | B | 0.30 | A | A |
|  | 26 | Ag—0.5Bi—0.5W—0.5V—0.5Zr | 79.6 | B | 0.50 | A | 93.6 | B | 0.25 | A | A |
|  | 27 | Ag—0.5Bi—0.5Ti—0.5Mn—0.5Cr—0.5W | 78.8 | B | 0.32 | A | 93.1 | B | 0.28 | A | A |
|  | 28 | Ag—0.5Bi—0.5V—0.5Mn—0.5Zr—0.5Cr—0.5W | 78.7 | B | 0.40 | A | 93.0 | B | 0.23 | A | A |

TABLE 7

| Category | No. | Ag reflective layer (average thickness, 15 nm) Composition (atomic %, the residue being Ag) | Initial reflectivity (%) | Evaluation result | Change in reflectivity (after 200 hours) | Evaluation result | Initial reflectivity (%) | Evaluation result | Change in reflectivity (after 200 hours) | Evaluation result | Overall evaluation result |
|---|---|---|---|---|---|---|---|---|---|---|---|
| Comparative Example | 29 | Pure Ag | 22.8 | B | 3.12 | C | 60.7 | B | 2.07 | C | C |
|  | 30 | Ag—0.003Bi—1W | 21.5 | B | 2.82 | C | 59.5 | B | 1.87 | C | C |
|  | 31 | Ag—1.5 Bi—1W | 21.3 | B | 2.39 | C | 59.4 | B | 1.79 | C | C |

TABLE 7-continued

| Category | No. | Ag reflective layer (average thickness, 15 nm) Composition (atomic %, the residue being Ag) | Moist heat resistance of the reflective layer 1 (wavelength, 405 nm) | | | | Moist heat resistance of the reflective layer 2 (wavelength, 650 nm) | | | | Overall evaluation result |
|---|---|---|---|---|---|---|---|---|---|---|---|
| | | | Initial reflectivity (%) | Evaluation result | Change in reflectivity (after 200 hours) | Evaluation result | Initial reflectivity (%) | Evaluation result | Change in reflectivity (after 200 hours) | Evaluation result | |
| | 32 | Ag—0.003Bi—1Ti | 21.9 | B | 2.65 | C | 59.6 | B | 1.00 | C | C |
| | 33 | Ag—1.5 Bi—1Ti | 21.4 | B | 2.34 | C | 59.3 | B | 1.30 | C | C |
| | 34 | Ag—0.003Bi—1V | 21.5 | B | 2.84 | C | 59.8 | B | 1.36 | C | C |
| | 35 | Ag—1.5 Bi—1V | 21.4 | B | 2.42 | C | 59.2 | B | 1.96 | C | C |
| | 36 | Ag—0.5Bi—0.04W | 22.4 | B | 2.66 | C | 60.1 | B | 1.70 | C | C |
| | 37 | Ag—0.5Bi—7.0W | 18.4 | C | 1.86 | B | 57.3 | C | 0.82 | B | C |
| | 38 | Ag—0.5Bi—0.04Ti | 22.3 | B | 2.87 | C | 60.2 | B | 1.68 | C | C |
| | 39 | Ag—0.5Bi—7.0Ti | 19.0 | C | 1.92 | B | 57.2 | C | 0.81 | B | C |
| | 40 | Ag—0.5Bi—0.04V | 22.1 | B | 2.74 | C | 60.1 | B | 1.98 | C | C |
| | 41 | Ag—0.5Bi—7.0V | 18.9 | C | 1.77 | B | 57.6 | C | 0.79 | B | C |
| | 42 | Ag—0.5Bi—0.04Mn | 22.4 | B | 2.85 | C | 60.0 | B | 1.87 | C | C |
| | 43 | Ag—0.5Bi—7.0Mn | 18.5 | C | 1.86 | B | 57.3 | C | 0.81 | B | C |
| | 44 | Ag—0.5Bi—1Nd | 21.4 | B | 2.68 | C | 59.2 | B | 1.52 | C | C |
| | 45 | Ag—0.5Bi—1Gd | 21.5 | B | 2.67 | C | 59.8 | B | 1.47 | C | C |
| | 46 | Ag—3Li | 21.3 | B | 2.54 | C | 59.4 | B | 1.36 | C | C |

TABLE 8

| Category | No. | Ag reflective layer (average thickness, 60 nm) Composition (atomic %, the residue being Ag) | Moist heat resistance of the reflective layer 1 (wavelength, 405 nm) | | | | Moist heat resistance of the reflective layer 2 (wavelength, 650 nm) | | | | Overall evaluation result |
|---|---|---|---|---|---|---|---|---|---|---|---|
| | | | Initial reflectivity (%) | Evaluation result | Change in reflectivity (after 200 hours) | Evaluation result | Initial reflectivity (%) | Evaluation result | Change in reflectivity (after 200 hours) | Evaluation result | |
| Comparative Example | 29 | Pure Ag | 80.8 | B | 2.31 | C | 95.5 | B | 1.21 | C | C |
| | 30 | Ag—0.003Bi—1W | 79.5 | B | 1.77 | C | 93.7 | B | 1.03 | C | C |
| | 31 | Ag—1.5 Bi—1W | 79.4 | B | 1.75 | C | 93.4 | B | 0.69 | C | C |
| | 32 | Ag—0.003Bi—1Ti | 79.1 | B | 1.75 | C | 93.8 | B | 1.02 | C | C |
| | 33 | Ag—1.5 Bi—1Ti | 79.5 | B | 1.77 | C | 94.4 | B | 0.93 | C | C |
| | 34 | Ag—0.003Bi—1V | 79.1 | B | 1.74 | C | 92.6 | B | 0.79 | C | C |
| | 35 | Ag—1.5 Bi—1V | 79.4 | B | 2.07 | C | 93.2 | B | 0.98 | C | C |
| | 36 | Ag—0.5Bi—0.04W | 79.5 | B | 1.87 | C | 92.9 | B | 0.71 | C | C |
| | 37 | Ag—0.5Bi—7.0W | 76.3 | C | 0.95 | B | 89.7 | C | 0.48 | B | C |
| | 38 | Ag—0.5Bi—0.04Ti | 79.7 | B | 1.96 | C | 94.0 | B | 0.97 | C | C |
| | 39 | Ag—0.5Bi—7.0Ti | 75.8 | C | 0.89 | B | 89.6 | C | 0.47 | B | C |
| | 40 | Ag—0.5Bi—0.04V | 79.5 | B | 1.84 | C | 92.9 | B | 0.70 | C | C |
| | 41 | Ag—0.5Bi—7.0V | 76.4 | C | 0.87 | B | 89.7 | C | 0.47 | B | C |
| | 42 | Ag—0.5Bi—0.04Mn | 79.8 | B | 1.89 | C | 92.8 | B | 0.99 | C | C |
| | 43 | Ag—0.5Bi—7.0Mn | 76.7 | C | 0.94 | B | 89.5 | C | 0.46 | B | C |
| | 44 | Ag—0.5Bi—1Nd | 79.1 | B | 1.87 | C | 92.7 | B | 0.94 | C | C |
| | 45 | Ag—0.5Bi—1Gd | 78.8 | B | 1.94 | C | 93.1 | B | 0.77 | C | C |
| | 46 | Ag—3Li | 78.6 | B | 1.38 | C | 94.2 | B | 0.67 | C | C |

The present invention is capable of providing an Ag alloy reflective layer for an optical information recording medium which has excellent environmental resistance particularly including the resistance to moist heat and the resistance to light, an optical information recording medium having such Ag alloy reflective layer, and a sputtering target for forming such Ag alloy reflective layer. Accordingly, the present invention is particularly adapted for producing a reflective layer which is required to have such environmental resistance, an optical information recording medium having such reflective layer, and a sputtering target for forming such reflective layer.

What is claimed is:

1. A silver (Ag) alloy reflective layer for an optical information recording medium having an excellent environmental resistance, comprising 0.1 to 5 atomic % in total of at least one element selected from W, Ti, V, Mn, Zr, Cr, and Ni, 0.005 to 1 atomic % of Bi, and the residue of Ag and inevitable impurities;

wherein the silver (Ag) alloy reflective layer is in direct contact with a UV curable resin layer formed thereon.

2. An optical information recording medium having an excellent environmental resistance, which has a silver (Ag) alloy reflective layer comprising 0.1 to 5 atomic % in total of at least one element selected from W, Ti, V, Mn, Zr, Cr, and Ni, 0.005 to 1 atomic % of Bi, and the residue of Ag and inevitable impurities;

wherein the silver (Ag) alloy reflective layer is in direct contact with a UV curable resin layer formed thereon.

3. A sputtering target for depositing a silver (Ag) alloy reflective layer, the sputtering target comprising
0.1 to 5 atomic % in total of at least one element selected from W, Ti, V, Mn, Zr, Cr, and Ni,
0.005 to 1.5 atomic % of Bi, and
the residue of Ag and inevitable impurities.

4. A silver (Ag) alloy reflective layer for an optical information recording medium having an excellent environmental resistance according to claim 1, wherein the silver (Ag) alloy reflective layer is adjacent to an organic dye recording layer.

5. An optical information recording medium having an excellent environmental resistance according to claim 2, wherein the silver (Ag) alloy reflective layer is adjacent to an organic dye recording layer.

6. A silver (Ag) alloy reflective layer for an optical information recording medium having an excellent environmental resistance according to claim 1, wherein the silver (Ag) alloy reflective layer is in direct contact with an organic dye recording layer.

7. An optical information recording medium having an excellent environmental resistance according to claim 2, wherein the silver (Ag) alloy reflective layer is in direct contact with an organic dye recording layer.

8. A silver (Ag) alloy reflective layer for an optical information recording medium having an excellent environmental resistance according to claim 1, comprising
0.1 to 5 atomic % in total of at least one element selected from W, Ti, V, Mn, Zr, Cr, and Ni,
0.005 to 0.5 atomic % of Bi, and
the residue of Ag and inevitable impurities.

9. An optical information recording medium having an excellent environmental resistance according to claim 2, which has a silver (Ag) alloy reflective layer comprising
0.1 to 5 atomic % in total of at least one element selected from W, Ti, V, Mn, Zr, Cr, and Ni,
0.005 to 0.5 atomic % of Bi, and
the residue of Ag and inevitable impurities.

10. A sputtering target for depositing a silver (Ag) alloy reflective layer, the sputtering target comprising
0.1 to 5 atomic % in total of at least one element selected from W, Ti, V, Mn, Zr, Cr, and Ni,
0.005 to 0.5 atomic % of Bi, and
the residue of Ag and inevitable impurities.

11. A silver (Ag) alloy reflective layer for an optical information recording medium having an excellent environmental resistance according to claim 1, comprising
0.1 to 1 atomic % in total of at least one element selected from W, Ti, V, Mn, Zr, Cr, and Ni,
0.005 to 0.5 atomic % of Bi, and
the residue of Ag and inevitable impurities.

12. An optical information recording medium having an excellent environmental resistance according to claim 2, which has a silver (Ag) alloy reflective layer comprising
0.1 to 1 atomic % in total of at least one element selected from W, Ti, V, Mn, Zr, Cr, and Ni,
0.005 to 0.5 atomic % of Bi, and
the residue of Ag and inevitable impurities.

13. A sputtering target for depositing a silver (Ag) alloy reflective layer, the sputtering target comprising
0.1 to 1 atomic % in total of at least one element selected from W, Ti, V, Mn, Zr, Cr, and Ni,
0.005 to 0.5 atomic % of Bi, and
the residue of Ag and inevitable impurities.

14. A silver (Ag) alloy reflective layer for an optical information recording medium having an excellent environmental resistance according to claim 1, comprising
0.1 to 5 atomic % in total of at least two elements selected from W, Ti, V, Mn, Zr, Cr, and Ni,
0.005 to 0.5 atomic % of Bi, and
the residue of Ag and inevitable impurities.

15. An optical information recording medium having an excellent environmental resistance according to claim 2, which has a silver (Ag) alloy reflective layer comprising
0.1 to 5 atomic % in total of at least two elements selected from W, Ti, V, Mn, Zr, Cr, and Ni,
0.005 to 0.5 atomic % of Bi, and
the residue of Ag and inevitable impurities.

16. A sputtering target for depositing a silver (Ag) alloy reflective layer, the sputtering target comprising
0.1 to 5 atomic % in total of at least two elements selected from W, Ti, V, Mn, Zr, Cr, and Ni,
0.005 to 0.5 atomic % of Bi, and
the residue of Ag and inevitable impurities.

17. A silver (Ag) alloy reflective layer for an optical information recording medium having an excellent environmental resistance according to claim 1, comprising
0.1 to 0.5 atomic % of each of at least two elements selected from W, Ti, V, Mn, Zr, Cr, and Ni,
0.005 to 0.5 atomic % of Bi, and
the residue of Ag and inevitable impurities.

18. An optical information recording medium having an excellent environmental resistance according to claim 2, which has a silver (Ag) alloy reflective layer comprising
0.1 to 0.5 atomic % of each of at least two elements selected from W, Ti, V, Mn, Zr, Cr, and Ni,
0.005 to 0.5 atomic % of Bi, and
the residue of Ag and inevitable impurities.

19. A sputtering target for depositing a silver (Ag) alloy reflective layer, the sputtering target comprising
0.1 to 0.5 atomic % of each of at least two elements selected from W, Ti, V, Mn, Zr, Cr, and Ni,
0.005 to 0.5 atomic % of Bi, and
the residue of Ag and inevitable impurities.

* * * * *